United States Patent [19]

Moser

[11] Patent Number: 5,194,922
[45] Date of Patent: Mar. 16, 1993

[54] LUMINESCENT SEMICONDUCTOR ELEMENT

[75] Inventor: Karl Moser, Heilbronn, Fed. Rep. of Germany

[73] Assignee: Telefunken electronic GmbH, Heilbronn, Fed. Rep. of Germany

[21] Appl. No.: 676,311

[22] Filed: Mar. 28, 1991

[30] Foreign Application Priority Data

Apr. 6, 1990 [DE] Fed. Rep. of Germany ....... 4011145

[51] Int. Cl.⁵ .......................................... H01L 33/00
[52] U.S. Cl. ......................................... 257/79; 257/9; 257/12; 257/94
[58] Field of Search ................................ 357/17, 16, 4

[56] References Cited

U.S. PATENT DOCUMENTS

| | | |
|---|---|---|
| 3,725,749 | 4/1973 | Groves et al. |
| 4,495,514 | 1/1985 | Lawrence et al. ................ 357/17 |
| 4,544,938 | 10/1985 | Scholl . |
| 4,865,655 | 9/1989 | Fujita et al. ..................... 357/17 |
| 4,912,532 | 3/1990 | Cook et al. ...................... 357/17 |
| 4,942,439 | 7/1990 | Schairer ........................... 357/17 |
| 4,987,472 | 1/1991 | Endo et al. ...................... 357/17 |
| 5,008,718 | 4/1991 | Fletcher et al. ................. 357/17 |
| 5,060,028 | 10/1991 | Kuo et al. ........................ 357/17 |

FOREIGN PATENT DOCUMENTS

| | | |
|---|---|---|
| 2819781 | 11/1978 | Fed. Rep. of Germany . |
| 60-214524 | 10/1985 | Japan ................................ 357/17 |
| 1426956 | 3/1976 | United Kingdom . |
| 1477415 | 6/1977 | United Kingdom . |
| 1549040 | 7/1979 | United Kingdom . |

OTHER PUBLICATIONS

Schwarzmichel, K: "Herstellung und . . . "; Siemens Forscl.-u. Eud-wicklungs-Ber. 9, 1980; S. 158-162.

Primary Examiner—Andrew J. James
Assistant Examiner—Courtney A. Bowers
Attorney, Agent, or Firm—Spencer, Frank & Schneider

[57] ABSTRACT

Described is a luminescent semiconductor element having the following structure: a first thick connecting semiconductor layer of uniform material composition, a thin over-graded layer arranged on the first semiconductor layer and comprising connecting semiconductor material whose composition has a linear gradient, a further connecting semiconductor layer arranged on the over-graded layer and having uniform material composition that determines the wavelength of the radiation emitted by the luminescent semiconductor element, an active layer arranged in the surface area of the further semiconductor layer and having a conductivity opposite to that of the further semiconductor layer in order to form a p-n junction, a rear contact arranged on the first connecting semiconductor layer, and a front contact arranged on the surface of the active layer.

4 Claims, 1 Drawing Sheet

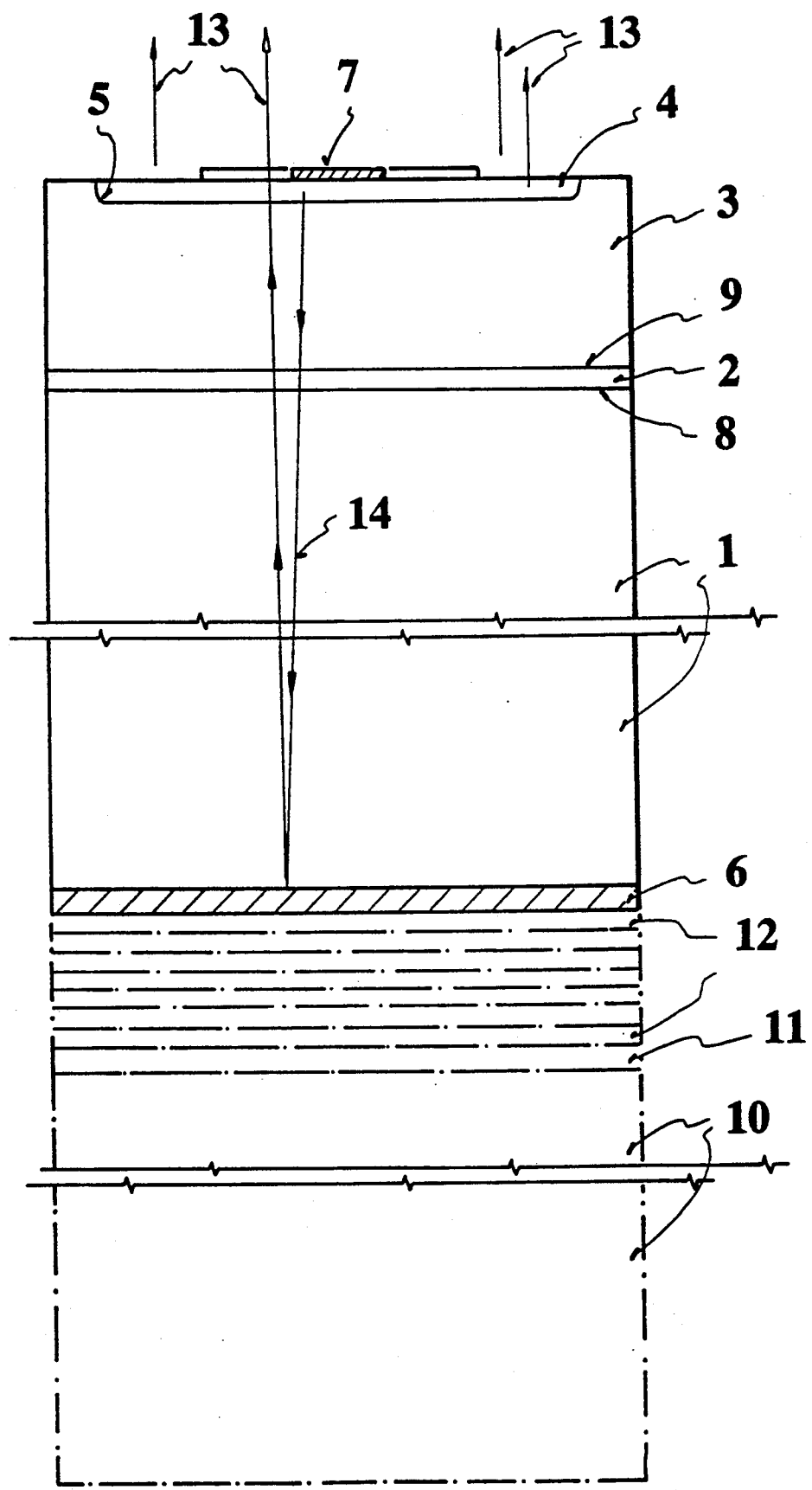

LUMINESCENT SEMICONDUCTOR ELEMENT

DESCRIPTION OF THE PRIOR ART

When manufacturing luminescent semiconductor elements or light-emitting diode chips (LED chips), several epitaxy layers—a buffer layer, several transition layers, a graded or matching layer and a constant layer—are deposited, for example by means of vapour phase epitaxy (VPE), onto a semiconductor substrate, the active light-emitting layer is diffused into it, the semiconductor substrate is denuded apart from a residual substrate, and a front contact is deposited onto the active layer and a rear contact onto the residual substrate.

However, in an LED chip of this type, the non-transparent residual substrate—for example 120-220 μm thick—absorbs the radiation emitted by the active layer in the direction of the rear contact, so that only the radiation emitted in the direction of the front contact contributes to light efficiency or to the overall radiation of the LED chip.

SUMMARY OF THE INVENTION

The object underlying the invention is to provide an improved LED chip.

This object is achieved in accordance with the invention by a luminescent semiconductor element for emitting radiation of a desired wavelength, which comprises: a first thick compound semiconductor layer of uniform material composition and transparent to the desired wavelength; a thin graded layer arranged on the first semiconductor layer and comprising compound semiconductor material whose composition has a linear gradient; a further compound semiconductor layer arranged on the graded layer and having a uniform material composition that determines the wavelength of the radiation emitted by the luminescent semiconductor element; an active layer arranged in a surface area of the further semiconductor layer and having a conductivity opposite to that of the further semiconductor layer in order to form a p-n junction; a rear contact arranged on the first compound semiconductor layer; and a front contact arranged on a surface of the active layer.

Advantageous embodiments of the invention are given in the sub-claims.

BRIEF DESCRIPTION OF THE DRAWING

The FIGURE schematically illustrates one embodiment of a luminescent semiconductor device according to the invention as well as the various layers formed, and subsequently removed, during the production of the device by the method according to the invention.

DETAILED DESCRIPTION OF THE PREFERRED EMBODIMENT

In accordance with the FIGURE, the finished LED chip in accordance with the invention comprises only epitaxially grown compound semiconductor layers 1, 2 and 3; the rear contact 6 is deposited onto the thick transition layer 1. The residual substrate 10 and further transition layers 12 are no longer present. The radiation 14 emitted in the direction of the transparent transition layer 1 is reflected at the rear contact 6 and thereby contributes to the overall radiation 13 of the LED chip, whereby on the one hand the light efficiency and brightness of the component are increased and on the other hand the reject rate is reduced. Furthermore, it is possible to incorporate within the finished LED chip—if necessary—dopants into the transition layer 1 in a regulatable quantity, which is not possible in the case of a conventional LED chip with a residual substrate.

In addition, the components are less prone to breakage, since the total layer thickness is considerably greater until the substrate and the transition layers are denuded.

The thickness of the transition layer is selected on the basis of assembly technology considerations; the composition of the transition layer 1 is selected such that it differs from that of the constant layer.

The LED chip in accordance with the invention and its manufacturing method are described in the following on the basis of an embodiment of a red-emitting ternary gallium-arsenide-phosphide LED.

A 3-6 μm thick gallium-arsenide (GaAs) buffer layer 11 and several gallium-arsenide-phosphide ($GaAs_xP_{1-x}$) transition layers 12, 1 are deposited using the VPE method onto a non-transparent substrate 10, for example 350-400 μm thick GaAs. The phosphorus concentration in the transition layers 12, 1 is slowly increased in stages—i.e. the value of x is lowered—in order to pass from the pure GaAs substrate 10 or GaAs buffer layer 11 to the constant layer 3 having the composition $GaAs_{0.6}P_{0.4}$ predetermined on the basis of the required red emission of the LED. The last transition layer 1 contains a higher proportion of phosphorus (for example $GaAs_{0.52}P_{0.48}$) than the constant layer 3, so that the layer composition can be adjusted, by means of the over-graded layer 2 used to compensate for the warping of the wafer, back to that of the constant layer 3 ($GaAs_{0.6}P_{0.4}$). Thus the graded or matching layer 2 has a composition which changes with a linear gradient from $GaAs_{0.52}P_{0.48}$ at the surface of the layer 3 to $GaAs_{0.6}P_{0.4}$ at the surface of the constant layer 3. The transition layers 12 are—without the last transition layer 1—20-40 μm thick all together, for example, whereas the transparent final transition layer 1 is grown to a thickness of 240 μm, for example. The thickness of the graded layer 2 depends on the warping of the wafer and is, for example, 2-10 μm.

Then the constant layer 3 with the composition $GaAs_{0.6}P_{0.4}$ predetermined by the colour of the red LED—for example with a thickness of 20-60 μm—is deposited.

In the surface of the constant layer 3—which has for example n-conductivity with a doping concentration of $10^{17}$ $cm^{-3}$—the active layer 4 or a p-n junction 5 is generated by diffusion of contradoping elements, for example Zn, to a thickness of 1 to 5 μm with a doping concentration of approximately $10^{18}$ $cm^{-3}$. The front contact 7—for example comprising an aluminum alloy—is then deposited by means of photolithographic processes, the rear of the GaAs substrate 10, the GaAs buffer layer 11 and the transition layers 12 to the top transition layer 1 are denuded by sanding and polishing, and the rear contact 6 is deposited onto the last transition layer 1.

With an LED chip of this type, it was possible to achieve a considerable increase in the light efficiency compared with conventional components. For example, use of a special highly reflecting rear contact of AuGe-Ag-Au material permitted a 27% increase in the light efficiency.

LEDs can also be manufactured in accordance with the invention using other material compositions of connecting semiconductor material, for example $GaAs_{0.35}P_{0.65}$ LEDs for the emission in the orange spectral range.

What is claimed is:

1. A luminescent semiconductor element for emitting radiation of a desired wavelength, comprising:
   a) a first thick compound semiconductor layer of uniform material composition and transparent to the desired wavelength;
   b) a thin graded layer arranged on said first semiconductor layer and comprising compound semiconductor material whose composition has a linear gradient;
   a further compound semiconductor layer arranged on said graded layer and having a uniform material composition that determines the wavelength of the radiation emitted by the luminescent semiconductor element;
   an active layer arranged in a surface area of said further compound semiconductor layer and having a conductivity opposite to that of said further compound semiconductor layer to form a p-n junction;
   a rear contact arranged on said first compound semiconductor layer; and
   a front contact arranged on a surface of said active layer; and
   wherein the compound semiconductor material is gallium-arsenide-phosphide having the composition $GaAs_xP_{1-x}$, with $x=0.52$ in the first semiconductor layer, with $x=0.6$ in the further semiconductor layer, and with the value for x changing from 0.52 to 0.6 in the graded layer.

2. A luminescent semiconductor element according to claim 1, wherein the first compound semiconductor layer has a thickness of at least 240 $\mu$m, the graded layer has a thickness of 2 $\mu$m to 10 $\mu$m, the further semiconductor layer has a thickness of 20 $\mu$m to 60 $\mu$m, and the active layer has a thickness of 1 $\mu$m to 5 $\mu$m.

3. A luminescent semiconductor element according to claim 1, wherein the further semiconductor layer has n-conductivity with a doping concentration of $10^{17}$ $cm^{-3}$, and wherein the active layer has p-conductivity with a doping concentration of approx. $10^{18}$ $cm^{-3}$.

4. A luminescent semiconductor element according to claim 3, wherein the first compound semiconductor layer has a thickness of at least 240 $\mu$m, the graded layer has a thickness of 2 $\mu$m to 10 $\mu$m, the further semiconductor layer has a thickness of 20 $\mu$m to 60 $\mu$m, and the active layer has a thickness of 1 $\mu$m to 5 $\mu$m.

* * * * *